US012781049B2

(12) United States Patent
Umeki et al.

(10) Patent No.: US 12,781,049 B2
(45) Date of Patent: Nov. 3, 2026

(54) PHOTOSENSITIVE POLYIMIDE RESIN COMPOSITION, RESIN FILM, AND ELECTRONIC DEVICE

(71) Applicant: MITSUBISHI GAS CHEMICAL COMPANY, INC., Tokyo (JP)

(72) Inventors: Miho Umeki, Tokyo (JP); Yumi Sato, Okayama (JP); Daichi Miyahara, Okayama (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 671 days.

(21) Appl. No.: 18/038,245

(22) PCT Filed: Nov. 10, 2021

(86) PCT No.: PCT/JP2021/041280
§ 371 (c)(1),
(2) Date: May 23, 2023

(87) PCT Pub. No.: WO2022/118620
PCT Pub. Date: Jun. 9, 2022

(65) Prior Publication Data

US 2023/0407089 A1 Dec. 21, 2023

(30) Foreign Application Priority Data

Dec. 2, 2020 (JP) ................................ 2020-200273

(51) Int. Cl.

| | |
|---|---|
| ***C08L 79/08*** | (2006.01) |
| ***C08F 2/44*** | (2006.01) |
| ***C08F 2/50*** | (2006.01) |
| ***C08F 290/06*** | (2006.01) |
| ***C08G 73/10*** | (2006.01) |
| ***C09D 151/08*** | (2006.01) |
| ***G03F 7/004*** | (2006.01) |
| ***G03F 7/027*** | (2006.01) |
| ***G03F 7/037*** | (2006.01) |
| ***G03F 7/20*** | (2006.01) |

(52) U.S. Cl.
CPC ................ *C08L 79/08* (2013.01); *C08F 2/44* (2013.01); *C08F 290/065* (2013.01); *C08G 73/10* (2013.01); *C08G 73/1007* (2013.01); *C08G 73/1025* (2013.01); *C08G 73/1039* (2013.01); *C08G 73/105* (2013.01); *C08G 73/1078* (2013.01); *C09D 151/08* (2013.01); *G03F 7/004* (2013.01); *G03F 7/027* (2013.01); *G03F 7/037* (2013.01); *G03F 7/20* (2013.01); *C08F 2/50* (2013.01)

(58) Field of Classification Search
None
See application file for complete search history.

(56) References Cited

U.S. PATENT DOCUMENTS

| | | | |
|---|---|---|---|
| 2008/0108723 A1 | 5/2008 | Taniguchi et al. |
| 2008/0146692 A1 | 6/2008 | Uehara et al. |
| 2016/0313641 A1 | 10/2016 | De et al. |
| 2019/0369496 A1 | 12/2019 | Kawabata |
| 2020/0110337 A1 | 4/2020 | Tanigaki et al. |

FOREIGN PATENT DOCUMENTS

| | | |
|---|---|---|
| EP | 3978549 | 4/2022 |
| JP | 2000-147761 A | 5/2000 |
| JP | 2005-309027 A | 11/2005 |
| JP | 2010-229210 A | 10/2010 |
| JP | 2014-24894 | 2/2014 |
| WO | 2006/098291 A1 | 9/2006 |
| WO | 2018/151195 A1 | 8/2018 |
| WO | 2018/181311 A1 | 10/2018 |

OTHER PUBLICATIONS

International Search Report issued Jan. 25, 2022 in International Bureau of WIPO Patent Application No. PCT/JP2021/041280, and English translation thereof.
Written Opinion issued Jan. 25, 2022 in International Bureau of WIPO Patent Application No. PCT/JP2021/041280, and English translation thereof.

*Primary Examiner* — Marc S Zimmer
*Assistant Examiner* — Virginia L Stonehocker
(74) *Attorney, Agent, or Firm* — GREENBLUM & BERNSTEIN, P.L.C.

(57) ABSTRACT

A photosensitive polyimide resin composition containing: a ring-closed polyimide resin (A) having a structure represented by Formula (1); and a polyfunctional radically polymerizable compound (B) having radically polymerizable functional groups and oxyalkylene groups, wherein a number of the radically polymerizable functional groups in the polyfunctional radically polymerizable compound (B) is 3 or greater and 100 or less, and wherein a total number of moles of the oxyalkylene groups added in the polyfunctional radically polymerizable compound (B) is 5 or greater and 100 or less.

18 Claims, No Drawings

PHOTOSENSITIVE POLYIMIDE RESIN COMPOSITION, RESIN FILM, AND ELECTRONIC DEVICE

TECHNICAL FIELD

The present invention relates to a photosensitive polyimide resin composition, a resin film, and an electronic device.

BACKGROUND ART

As an insulating film forming an electronic device, a resin film produced by exposing a photosensitive polyimide resin composition, which has excellent heat resistance and insulating properties, has been widely used.

Examples of techniques relating to such a photosensitive polyimide resin composition include those described in Patent Documents 1 and 2.

Patent Document 1 describes a photosensitive polyimide composition containing a photosensitive polyimide produced by reacting a first polyimide having a ring-closed imide structure with an isocyanate compound having a carbon-carbon double bond.

Patent Document 2 describes a photosensitive resin composition containing: a polyimide, a polybenzoxazole, a polyamide-imide, a precursor of any of them, or a copolymer of them, which has an alkoxymethyl group or a methylol group; and a compound having at least two alkoxymethyl groups or methylol groups.

CITATION LIST

Patent Document

Patent Document 1: JP 2000-147761 A
Patent Document 2: JP 2010-229210 A

SUMMARY OF INVENTION

Technical Problem

In recent years, demands for reduction in size and improvement in performance of electronic devices tend to increase more and more, and development of a photosensitive resin composition capable of forming a resist with a large film thickness is required.

Here, according to the studies of the present inventors, it has been revealed that a photosensitive polyimide resin composition using a known ring-closed polyimide resin has room for improvement in flexibility when formed into a thick film.

The present invention has been made in view of the above circumstances and provides a photosensitive polyimide resin composition having an excellent balance between thick-film heat resistance and thick-film flexibility.

Solution to Problem

The present inventors have diligently studied to solve the above problems. As a result, the present inventors have found that the balance between thick-film heat resistance and thick-film flexibility of a photosensitive polyimide resin composition can be improved by combining a ring-closed polyimide resin (A) having a specific structure with a polyfunctional radically polymerizable compound (B) having 3 or more and 100 or less radically polymerizable functional groups and oxyalkylene groups having a total number of added moles of 5 or greater and 100 or less.

That is, the present invention provides a photosensitive polyimide resin composition, a resin film, and an electronic device as will be described below.

[1]

A photosensitive polyimide resin composition containing: a ring-closed polyimide resin (A) having a structure represented by Formula (1); and a polyfunctional radically polymerizable compound (B) having radically polymerizable functional groups and oxyalkylene groups, wherein a number of the radically polymerizable functional groups in the polyfunctional radically polymerizable compound (B) is 3 or greater and 100 or less, and wherein a total number of moles of the oxyalkylene groups added in the polyfunctional radically polymerizable compound (B) is 5 or greater and 100 or less:

(1)

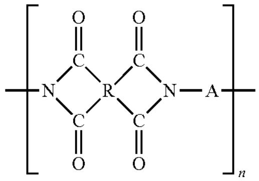

where R is a tetravalent group with 4 or more and 10 or less carbons, having a cyclic structure, an acyclic structure, or a cyclic structure and an acyclic structure; A has at least one group selected from the group consisting of an aliphatic hydrocarbon group, an alicyclic hydrocarbon group, an aromatic hydrocarbon group, and an organosiloxane group, and is a divalent group with 2 or more and 39 or less carbons; on a main chain of A, at least one intervening group selected from the group consisting of —O—, —$SO_2$—, —CO—, —$CH_2$—, —$C(CH_3)_2$—, —$C_2H_4O$—, and —S— may be present; n represents a number of repeating units; terminal ends of Formula (1) are each selected from the group consisting of a group represented by Formula (2), a group represented by Formula (3), and a hydrogen atom, and at least one of the terminal ends is a group represented by Formula (2) or (3), (2)

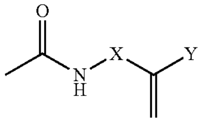

(3)

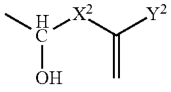

where X and $X^2$ are each independently a group with 2 or more and 15 or less carbons, and may have at least one group selected from the group consisting of ester bonds and double bonds; and Y and $Y^2$ are each independently a hydrogen atom or a methyl group.

[2]

The photosensitive polyimide resin composition according to [1], wherein a weight average molecular weight of the ring-closed polyimide resin (A) is 5000 or greater and 70000 or less.

[3]

The photosensitive polyimide resin composition according to [1] or [2], wherein a content of the ring-closed polyimide resin (A) is 30 mass % or greater when a total solid content of the photosensitive polyimide resin composition is 100 mass %.

[4]

The photosensitive polyimide resin composition according to any one of [1] to [3], wherein a content of the polyfunctional radically polymerizable compound (B) is 20 parts by mass or greater and 100 parts by mass or less when an amount of the ring-closed polyimide resin (A) contained in the photosensitive polyimide resin composition is 100 parts by mass.

[5]

The photosensitive polyimide resin composition according to any one of [1] to [4], wherein each of the radically polymerizable functional groups contains a (meth)acryloyl group.

[6]

The photosensitive polyimide resin composition according to any one of [1] to [5], wherein each of the oxyalkylene groups contains at least one selected from the group consisting of an oxyethylene group and an oxypropylene group.

[7]

The photosensitive polyimide resin composition according to any one of [1] to [6], wherein the number of the radically polymerizable functional groups in the polyfunctional radically polymerizable compound (B) is 6 or greater.

[8]

The photosensitive polyimide resin composition according to any one of [1] to [7], wherein a number average molecular weight of the polyfunctional radically polymerizable compound (B) is 500 or greater and 10000 or less.

[9]

The photosensitive polyimide resin composition according to any one of [1] to [8], wherein an elongation rate at break of a resin film having a thickness of 30 μm is 8% or greater, the resin film being produced by:

- prebaking the photosensitive polyimide resin composition at 100° C. for 5 minutes;
- exposing the prebaked photosensitive polyimide resin composition to light irradiated from a high-pressure mercury lamp, with wavelengths of less than 365 nm being cut off, at an optimum exposure amount within a range of 250 mJ/cm$^2$ or greater and 5000 mJ/cm$^2$ or less; and then
- heating the exposed photosensitive polyimide resin composition under conditions: at 200° C. for 2 hours in a nitrogen atmosphere.

[10]

The photosensitive polyimide resin composition according to any one of [1] to [9], wherein a glass transition temperature of a resin film having a thickness of 30 μm is 180° C. or higher, the resin film being produced by:

- prebaking the photosensitive polyimide resin composition at 100° C. for 5 minutes;
- exposing the prebaked photosensitive polyimide resin composition to light irradiated from a high-pressure mercury lamp, with wavelengths of less than 365 nm being cut off, at an optimum exposure amount within a range of 250 mJ/cm$^2$ or greater and 5000 mJ/cm$^2$ or less; and then
- heating the exposed photosensitive polyimide resin composition under conditions: at 200° C. for 2 hours in a nitrogen atmosphere.

[11]

The photosensitive polyimide resin composition according to any one of [1] to [10], wherein a light transmittance at a wavelength of 365 nm of the ring-closed polyimide resin (A), when formed into a solution with a solid content concentration of 3 mass %, is 80% or greater.

[12]

The photosensitive polyimide resin composition according to any one of [1] to [11], wherein A in Formula (1) includes an aromatic ring as the aromatic hydrocarbon group.

[13]

The photosensitive polyimide resin composition according to any one of [1] to [12], wherein A in Formula (1) includes at least one selected from the group consisting of the following structures:

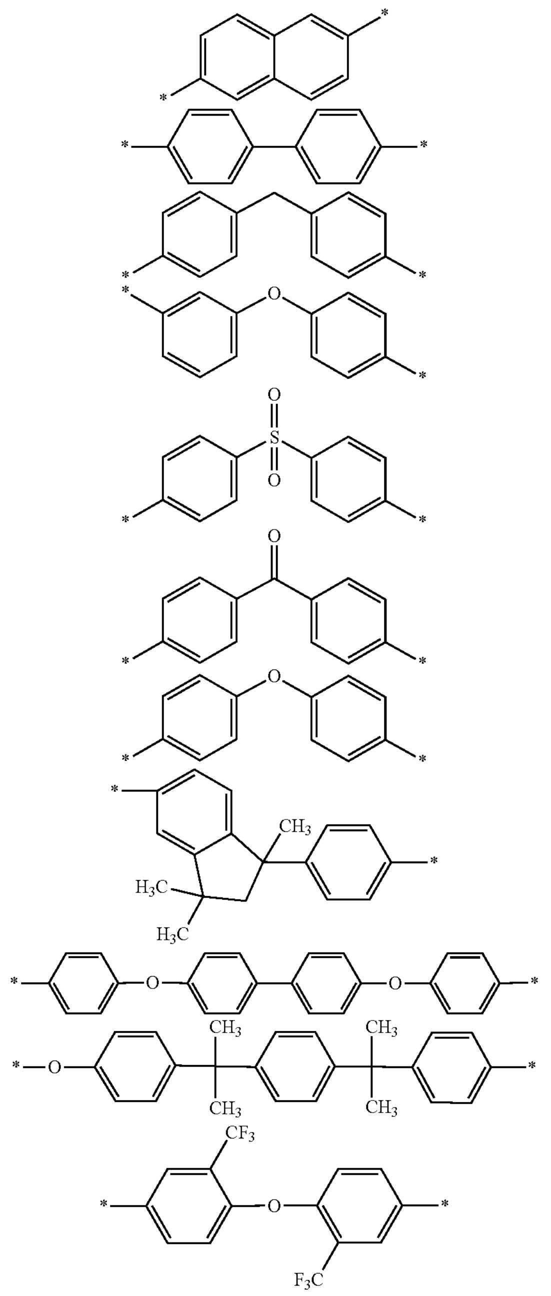

-continued

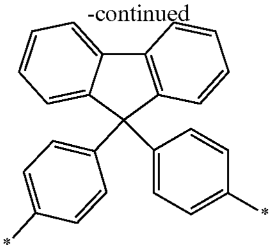

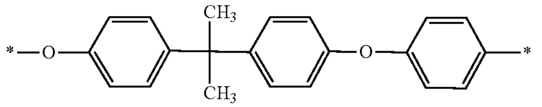

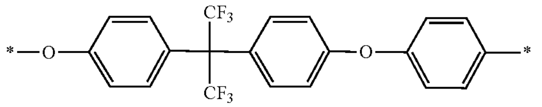

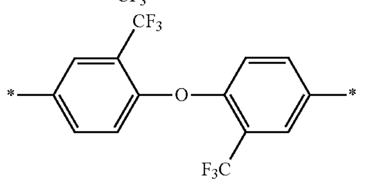

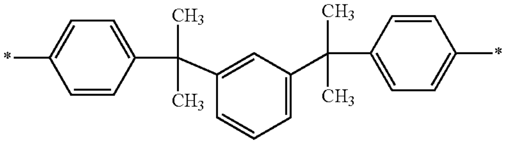

where * indicates an atomic bond.

[14]

The photosensitive polyimide resin composition according to any one of [1] to [13], wherein the ring-closed polyimide resin (A) includes at least one of units composed of 4,4'-diamino-2,2'-bis(trifluoromethyl)biphenyl, 1-(4-aminophenyl)-2,3-dihydro-1,3,3-trimethyl-1H-inden-5-amine, 4,4'-oxybis[3-(trifluoromethyl)benzenamine] or 1,3-bis[2-(4-aminophenyl)-2-propyl]benzene.

[15]

The photosensitive polyimide resin composition according to any one of [1] to [14], further containing at least one selected from the group consisting of a photopolymerization initiator, a solvent, an adhesion improver, a surface conditioner, and a sensitizer.

[16]

The photosensitive polyimide resin composition according to any one of [1] to [15], wherein the photosensitive polyimide resin composition is used for forming an insulating film.

[17]

A resin film including: the photosensitive polyimide resin composition described in any one of [1] to [16] or a cured product of the photosensitive polyimide resin composition.

[18]

The resin film according to [17], wherein a thickness of the resin film is 20 μm or greater.

[19]

An electronic device including: the resin film described in [18].

Advantageous Effects of Invention

The present invention can provide a photosensitive polyimide resin composition having an excellent balance between thick-film heat resistance and thick-film flexibility.

DESCRIPTION OF EMBODIMENTS

Hereinafter, embodiments for carrying out the present invention (hereinafter, referred to simply as "the present embodiment") will be described in detail. The following embodiments are examples for explaining the present invention, and do not limit the contents of the present invention. The present invention can be modified as appropriate within the scope of the gist. In the present embodiment, the preferred stipulations can be optionally employed, and combinations of the preferred ones are considered more preferable. In the present embodiment, the phrase "from XX to YY" means "XX or greater and YY or less".

The term "(meth)acrylate" includes both "acrylate" and "methacrylate". The same applies to other similar terms ("(meth)acrylic acid", "(meth)acryloyl group", etc.).

1. Photosensitive Polyimide Resin Composition

The photosensitive polyimide resin composition according to the present embodiment contains: a ring-closed polyimide resin (A) having a structure represented by Formula (1); and a polyfunctional radically polymerizable compound (B) having radically polymerizable functional groups and oxyalkylene groups, wherein a number of the radically polymerizable functional groups in the polyfunctional radically polymerizable compound (B) is 3 or greater and 100 or less, and wherein a total number of moles of the oxyalkylene groups added in the polyfunctional radically polymerizable compound (B) is 5 or greater and 100 or less.

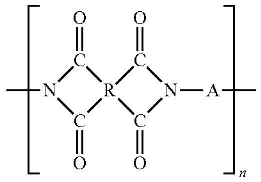

(1)

In Formula (1), R is a tetravalent group with 4 or more and 10 or less carbons, having a cyclic structure, an acyclic structure, or a cyclic structure and an acyclic structure. A has at least one group selected from the group consisting of an aliphatic hydrocarbon group, an alicyclic hydrocarbon group, an aromatic hydrocarbon group, and an organosiloxane group, and is a divalent group with 2 or more and 39 or less carbons. On a main chain of A, at least one intervening group selected from the group consisting of —O—, $—SO_2—$, —CO—, $—CH_2—$, $—C(CH_3)_2—$, $—C_2H_4O—$, and —S— may be present. n represents a number of repeating units. Terminal ends of Formula (1) are each selected from the group consisting of a group represented by Formula (2), a group represented by Formula (3), or a hydrogen atom, and at least one of the terminal ends is a group represented by Formula (2) or (3).

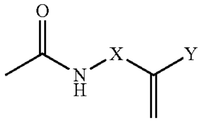

(2)

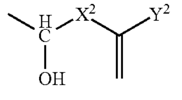

(3)

In Formulas (2) and (3) above, X and $X^2$ are each independently a group with 2 or more and 15 or less carbons, and may have at least one group selected from the group consisting of ester bonds and double bonds. Y and $Y^2$ are each independently a hydrogen atom or a methyl group.

The photosensitive polyimide resin composition according to the present embodiment contains: a ring-closed polyimide resin (A) having a structure represented by Formula (1); and a polyfunctional radically polymerizable compound (B) having 3 or more and 100 or less radically polymerizable functional groups and oxyalkylene groups having a total number of added moles of 5 or greater and 100 or less, and is a composition excellent in balance between thick-film heat resistance and thick-film flexibility. In addition, the photosensitive polyimide resin composition according to the present embodiment is excellent in balance between thick-film heat resistance and thick-film flexibility, and thus it is possible to effectively suppress occurrence of cracking, chipping, breaking, or the like of the produced resin film.

In the present embodiment, the phrase "excellent thick-film heat resistance" means that the resin film, when having a large thickness of, for example, 20 μm or greater, has a high glass transition temperature. In the present embodiment, the phrase "excellent thick-film flexibility" means that the resin film, when having a large thickness of, for example, 20 μm or greater, has a high elongation rate at break.

The photosensitive polyimide resin composition according to the present embodiment contains: the ring-closed polyimide resin (A) having the structure represented by Formula (1); and the polyfunctional radically polymerizable compound (B) having 3 or more and 100 or less radically polymerizable functional groups and oxyalkylene groups having a total number of added moles of 5 or greater and 100 or less, and thus is excellent in balance between thick-film heat resistance and thick-film flexibility. The reason for this is not clear but is assumed to be as follows.

First, the ring-closed polyimide resin (A) having the structure represented by Formula (1) is excellent in transparency. Thus, even when the resin film is made thick, light at the time of exposure easily reaches a lower part of the film, and the resin film can be more uniformly crosslinked, and is excellent in thick-film curability. Further, it is conceivable that combination of the ring-closed polyimide resin (A) with the polyfunctional radically polymerizable compound (B) improves a crosslinking density of the resin film, and can improve the thick-film heat resistance.

In addition, the ring-closed polyimide resin (A) is a resin in which imidization has already been completed, and thus a dehydration ring-closing step is not necessary. Therefore, it is conceivable that combination of the ring-closed polyimide resin (A) with the polyfunctional radically polymerizable compound (B) having oxyalkylene groups can suppress curing shrinkage of the resin film at the time of exposure and improve the thick-film flexibility. Here, the use of the polyfunctional radically polymerizable compound having an oxyalkylene group can improve the flexibility of the produced resin film, but the heat resistance of the resin film tends to decrease. However, it is conceivable that the use of the polyfunctional radically polymerizable compound (B) in which the number of radically polymerizable functional groups and the total number of moles of the oxyalkylene groups added fall within the above ranges, the crosslinked structure of the produced resin film becomes a well-balanced structure from the perspective of achieving both heat resistance and flexibility, and that it is possible to improve the flexibility while suppressing a decrease in heat resistance of the resin film.

As described above, it is conceivable that, in the photosensitive polyimide resin composition according to the present embodiment, the balance between the thick-film heat resistance and the thick-film flexibility can be improved by combining the ring-closed polyimide resin (A) with the polyfunctional radically polymerizable compound (B).

[Ring-closed Polyimide Resin (A)]

The ring-closed polyimide resin (A) according to the present embodiment has a structure represented by Formula (1).

(1)

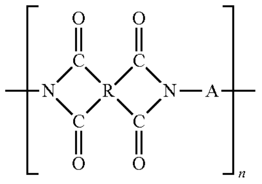

In Formula (1), R is a tetravalent group with 4 or more and 10 or less carbons, having a cyclic structure, an acyclic structure, or a cyclic structure and an acyclic structure. A has at least one group selected from the group consisting of an aliphatic hydrocarbon group, an alicyclic hydrocarbon group, an aromatic hydrocarbon group, and an organosiloxane group, and is a divalent group with 2 or more and 39 or less carbons. On a main chain of A, at least one intervening group selected from the group consisting of —O—, —$SO_2$—, —CO—, —$CH_2$—, —$C(CH_3)_2$—, —$C_2H_4O$—, and —S— may be present. n represents a number of repeating units. Terminal ends of Formula (1) are each selected from the group consisting of a group represented by Formula (2), a group represented by Formula (3), or a hydrogen atom, and at least one of the terminal ends is a group represented by Formula (2) or (3).

(2)

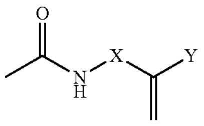

(3)

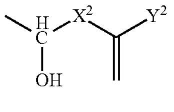

In Formulas (2) and (3) above, X and $X^2$ are each independently a group with 2 or more and 15 or less carbons, and may have at least one group selected from the group consisting of ester bonds and double bonds. Y and $Y^2$ are each independently a hydrogen atom or a methyl group.

R in Formula (1) preferably has at least a cyclic structure, and examples of the cyclic structure include tetravalent groups formed by removal of four hydrogen atoms from cyclohexane, cyclopentane, cyclobutane, bicyclopentane, and these stereoisomers. More specifically, examples of the tetravalent group include a group represented by the following structural formulas.

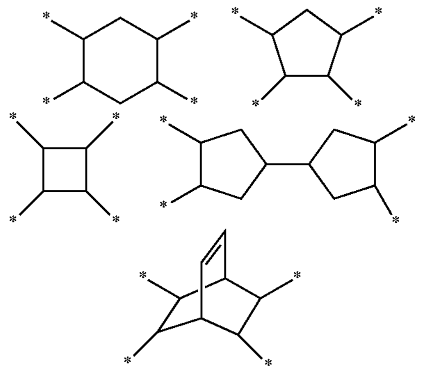

In these formulas, * indicates an atomic bond.

Among the above ones, a tetravalent group formed by removal of four hydrogen atoms from cyclohexane is preferable.

In Formula (1), A is a divalent group with 2 or more and 39 or less carbons, having at least one group selected from the group consisting of an aliphatic hydrocarbon group, an alicyclic hydrocarbon group, an aromatic hydrocarbon group, and an organosiloxane group. On a main chain of A, at least one intervening group selected from the group consisting of —O—, —$SO_2$—, —CO—, —$CH_2$—, —$C(CH_3)_2$—, —$C_2H_4O$—, and —S— may be present.

More specifically, A includes a divalent group formed by removal of two hydrogen atoms from a compound such as cyclohexane, dicyclohexylmethane, dimethylcyclohexane, isophorone, norbornane and alkyl substitutes thereof and halogen substitutes thereof; benzene, naphthalene, biphenyl, diphenylmethane, diphenyl ether, diphenylsulfone, benzophenone and alkyl substitutes thereof and halogen substitutes thereof; and organo(poly)siloxanes. A preferably has a cyclic structure, and more preferably has at least one selected from the group consisting of an alicyclic hydrocarbon group and an aromatic ring. Further preferably, A has an aromatic ring as an aromatic hydrocarbon group. More specifically, a divalent group having 6 or more and 27 or less carbons represented by the following structural formulas is preferable.

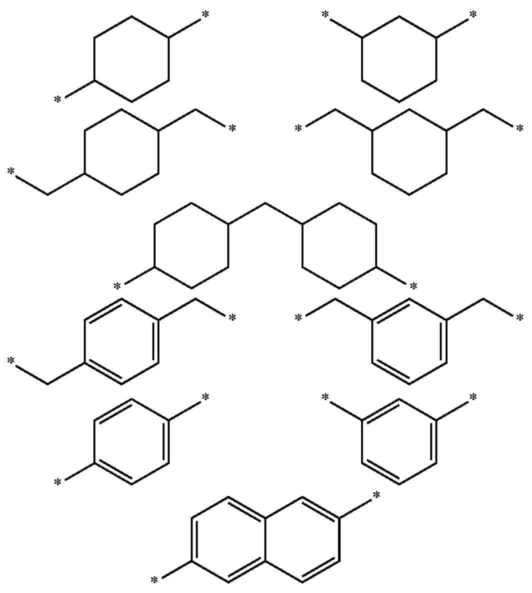

-continued

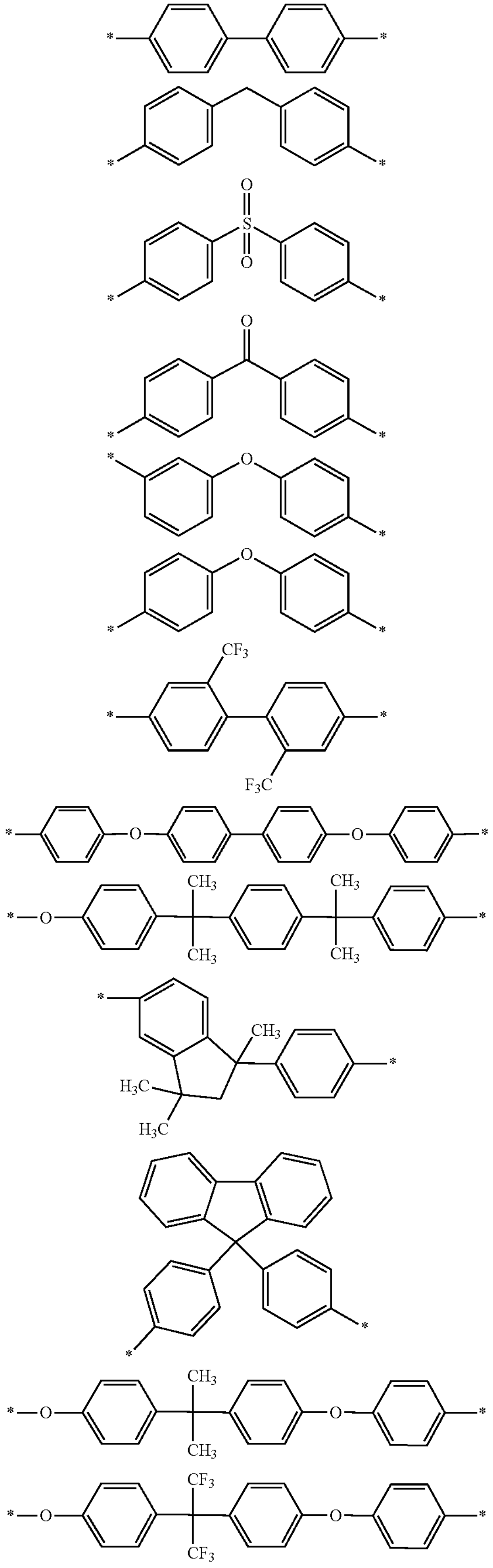

-continued

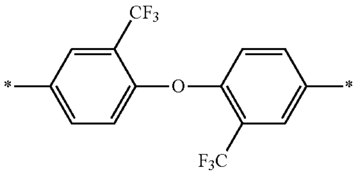

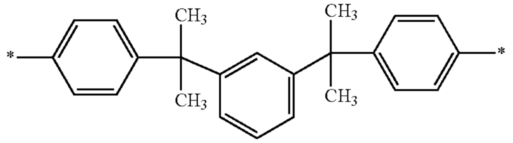

In these formulas, * indicates an atomic bond.

The divalent group with 2 or more and 39 or less carbons represented by A more preferably includes at least one selected from the group consisting of structures which will be shown below.

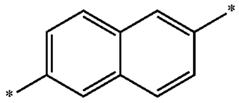

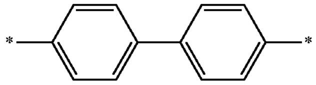

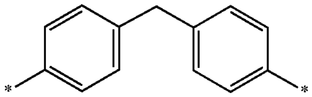

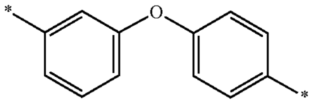

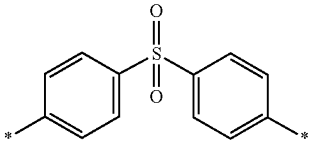

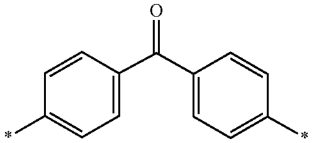

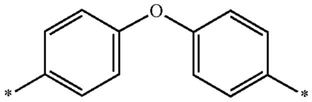

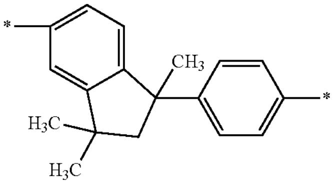

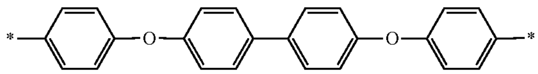

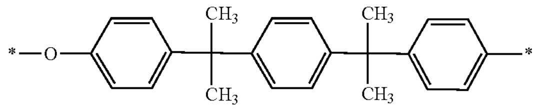

-continued

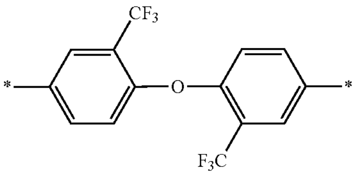

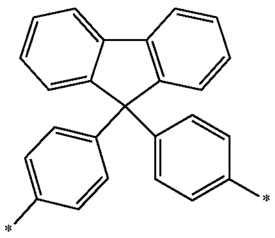

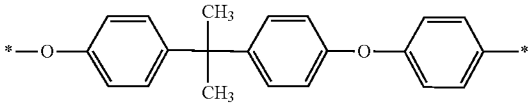

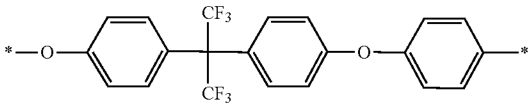

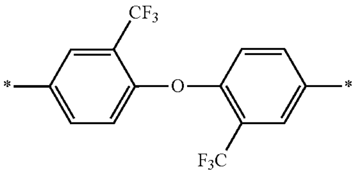

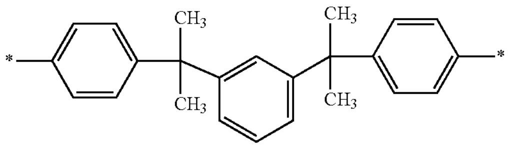

In these formulas, * indicates an atomic bond.

The divalent group with 2 or more and 39 or less carbons represented by A further preferably includes at least one group (I-a) selected from the group consisting of structures which will be shown below.

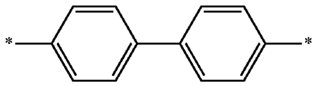

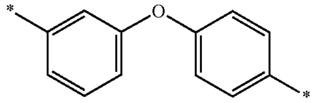

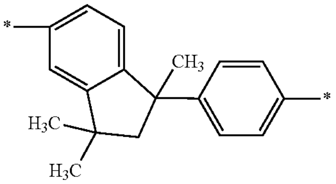

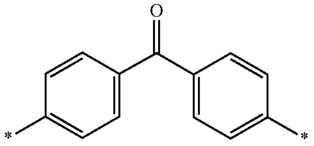

-continued

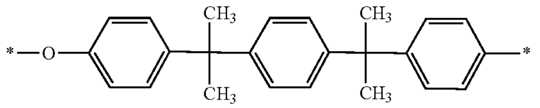

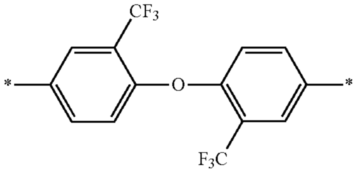

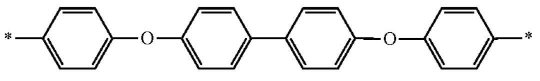

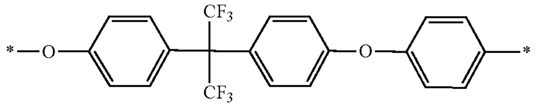

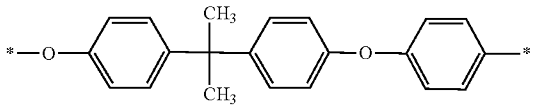

In these formulas, * indicates an atomic bond.

The divalent group with 2 or more and 39 or less carbons represented by A further preferably includes at least one group (I-b) selected from the group consisting of structures which will be shown below.

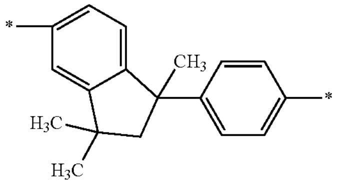

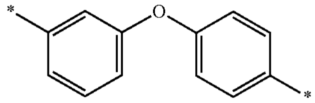

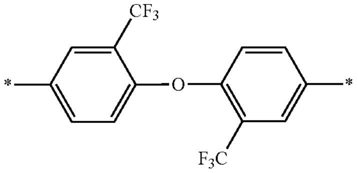

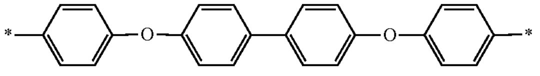

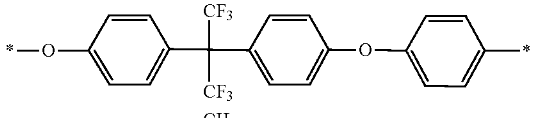

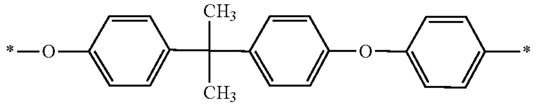

In these formulas, * indicates an atomic bond.

The divalent group with 2 or more and 39 or less carbons represented by A further preferably includes Formula (I-c).

(I-c)

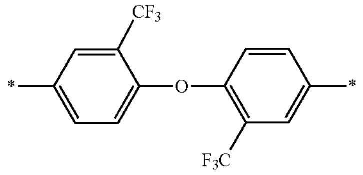

In this formula, * indicates an atomic bond.

In the ring-closed polyimide resin (A) according to the present embodiment, a proportion of at least one structural unit selected from the group consisting of the (I-a), (I-b), and (I-c) as A in Formula (I) is preferably 60 mol % or greater from the perspective of solubility in a developer (hereinafter also simply referred to as "developer solubility".

The proportion of at least one structural unit selected from the group consisting of the (I-a), (I-b), and (I-c) as A in Formula (I) is more preferably 70 mol % or greater, further preferably 80 mol % or greater, still further preferably 95 mol % or greater, and even still further preferably 100 mol %. Among them, preferably, the structural units derived from the diamine represented by formula (I-c) are included in the above proportion.

n indicating the number of repeating units of the structural units represented by Formula (I) is preferably 5 or greater, more preferably 10 or greater, and further preferably 15 or greater from the perspective of further improving mechanical properties of the produced resin film, and is preferably 250 or less, more preferably 200 or less, and further preferably 150 or less from the perspective of further improving the developer solubility of the produced photosensitive polyimide resin composition.

The ring-closed polyimide resin (A) according to the present embodiment has terminal ends each of which is either the group represented by Formula (2) or (3), or a hydrogen atom, and at least one of the terminal ends is a group represented by Formula (2) or (3). The ring-closed polyimide resin (A) may have a structure represented by Formula (2) or (3) above at one of the terminal ends, or may have a structure represented by Formula (2) or (3) above on both of the terminal ends.

The group represented by X or $X^2$ in Formula (2) or (3) is a group with 2 or more and 15 or less carbons, and may have at least one group selected from the group consisting of ester bonds and double bonds. The group represented by Y or $Y^2$ is a hydrogen atom or a methyl group.

More specifically, the structure represented by Formula (2) or (3) corresponds to a structure produced by reacting a terminal amine of the polyimide resin with a functional group-containing compound. Examples of the functional group-containing compound include compounds having an isocyanate group or an epoxy group and a (meth)acryl group. Examples of the compound include 2-isocyanatoethyl methacrylate, 2-isocyanatoethyl acrylate, 1,1-bis(acryloyloxymethyl)ethyl isocyanate, glycidyl methacrylate, glycidyl acrylate, and allyl glycidyl ether. The structure represented by Formula (2) or (3) may have a structure formed by reacting the compound with an amine terminal of the polyimide resin.

The weight average molecular weight of the ring-closed polyimide resin (A) is preferably 70000 or less, more preferably 60000 or less, even more preferably 50000 or less, further preferably 45000 or less, even further preferably 40000 or less, and still even further preferably 35000 or less from the perspective of further improving the developer solubility and thick-film developability of the photosensitive polyimide resin composition, and is preferably 5000 or greater, more preferably 10000 or greater, further preferably 13000 or greater, and even further preferably 15000 or greater from the perspective of further improving the mechanical properties of the produced resin film. The weight average molecular weight of the ring-closed polyimide resin (A) is within the range described above, and thus the developer solubility can be improved. Therefore, a residual film rate of an unexposed portion can be made lower, and the developability of the photosensitive polyimide resin composition can be further improved. Here, the weight average molecular weight is a weight average molecular weight in terms of polystyrene.

The photosensitive polyimide resin composition according to the present embodiment contains: the ring-closed polyimide resin (A) having the structure represented by Formula (1) and having a weight average molecular weight of 70000 or less; and the polyfunctional radically polymerizable compound (B) having 3 or more and 100 or less radically polymerizable functional groups and oxyalkylene groups having a total number of added moles of 5 or greater and 100 or less, and thus has an excellent balance among thick-film developability, thick-film heat resistance, and thick-film flexibility. The reason why the thick-film developability can be improved is not clear but is assumed to be as follows.

First, the developability is better as a difference in developer solubility between an exposed portion and an unexposed portion is greater. In order to improve the developability, it is important to increase the difference in developer solubility between the exposed portion and the unexposed portion.

Here, it is conceivable that, since the ring-closed polyimide resin (A) having the structure represented by Formula (1) and a weight average molecular weight of 70000 or less has high developer solubility, the unexposed portion has high developer solubility even when the thickness of the resin film is increased.

Also, the ring-closed polyimide resin (A) having the structure represented by Formula (1) above is excellent in transparency. Thus, even when the resin film is made thick, light at the time of exposure easily reaches a lower part of the film, and the resin film can be more uniformly cross-linked. Further, it is conceivable that combination of the ring-closed polyimide resin (A) with the polyfunctional radically polymerizable compound (B) improves the cross-linking density of the resin film, and can decrease the developer solubility of the exposed portion.

As described above, it is conceivable that, in the photosensitive polyimide resin composition according to the present embodiment, the difference in developer solubility between the exposed portion and the unexposed portion can be increased by combining the ring-closed polyimide resin (A) with the polyfunctional radically polymerizable compound (B), and thus that the thick-film developability can be improved.

The ring-closed polyimide resin (A) can be produced by reacting a diamine component and a tetracarboxylic acid component which will be described in detail below.

<Diamine Component>

Examples of the diamine component include diamine, diisocyanate and diaminodisilane, and diamine is preferable. A diamine content of the diamine component used as a raw material is preferably 50 mol % or greater, more preferably 70 mol % or greater, further preferably 90 mol % or greater, and even further preferably 95 mol % or greater, and preferably 100 mol % or less.

The diamine may be an aliphatic diamine or an aromatic diamine and may be a mixture thereof. In the present embodiment, the "aromatic diamine" refers to a diamine in which an amino group is directly bonded to an aromatic ring, and may include an aliphatic group, an alicyclic group, or any other substituent in part of the structure. The "aliphatic diamine" refers to a diamine in which an amino group is directly bonded to an aliphatic group or an alicyclic group, and may include an aromatic group or any other substituent in part of the structure.

In general, when an aliphatic diamine is used as a raw material of a polyimide resin, a polyamide acid which is an intermediate product and the aliphatic diamine form a strong complex, making it difficult to produce a high-molecular weight polyimide. Therefore, measures such as the use of a solvent in which the complex has a relatively high solubility, for example, using cresols, is required. When cyclohexanetetracarboxylic acid, cyclobutanetetracarboxylic acid, or derivative thereof is used as the tetracarboxylic acid component, a complex having a relatively weak bond between the polyamic acid and the aliphatic diamine is formed. Thus, the molecular weight of the polyimide can be easily increased. When a diamine having a fluorine substituent is selected as a raw material, transparency of the produced polyimide resin is excellent, which is preferable.

Examples of the aliphatic diamine include 4,4'-diaminodicyclohexylmethane, ethylenediamine, hexamethylenediamine, polyethyleneglycol bis(3-aminopropyl)ether, polypropyleneglycol bis(3-aminopropyl)ether, 1,3-bis(aminomethyl)cyclohexane, 1,4-bis(aminomethyl)cyclohexane, m-xylylenediamine, p-xylylenediamine, isophorone diamine, norbornane diamine, and siloxane diamines.

Examples of the aromatic diamine include 4,4'-diaminodiphenyl ether, 4,4'-diaminodiphenylmethane, 4,4'-diaminodiphenyl sulfone, m-phenylenediamine, p-phenylenediamine, diaminobenzophenone, 2,6-diaminonaphthalene, 1,5-diaminonaphthalene, 4,4'-diamino-2,2'-bis(trifluoromethyl)biphenyl, 4,4'-oxybis[3-(trifluoromethyl)benzenamine], 1-(4-aminophenyl)-2,3-dihydro-1,3,3-trimethyl-1H-inden-5-amine, and 1,3-bis[2-(4-aminophenyl)-2-propyl]benzene.

The diamine component preferably contains at least one selected from the group consisting of 4,4'-diamino-2,2'-bis(trifluoromethyl)biphenyl, 1-(4-aminophenyl)-2,3-dihydro-1,3,3-trimethyl-1H-inden-5-amine, 4,4'-oxybis[3-(trifluoromethyl)benzenamine], and 1,3-bis[2-(4-aminophenyl)-2-propyl]benzene.

Such a diamine contained as the diamine component can further improve the light transmittance at a specific wavelength and developer solubility of the produced photosensitive polyimide resin composition. As a result, curability of the exposed portion can be improved and the residual film rate of the unexposed portion can be lowered, and thus the developability of the produced photosensitive polyimide resin composition can be further improved.

The ring-closed polyimide resin (A) according to the present embodiment preferably contains at least one of units composed of 4,4'-diamino-2,2'-bis(trifluoromethyl)biphenyl, 1-(4-aminophenyl)-2,3-dihydro-1,3,3-trimethyl-1H-inden-5-amine, 4,4'-oxybis[3-(trifluoromethyl)benzenamine] or 1,3-bis[2-(4-aminophenyl)-2-propyl]benzene.

<Tetracarboxylic Acid Component>

Examples of the tetracarboxylic acid component include cyclohexanetetracarboxylic acid, cyclohexanetetracarboxylic esters, cyclohexanetetracarboxylic dianhydride, cyclobutanetetracarboxylic acid, cyclobutanetetracarboxylic esters, cyclobutanetetracarboxylic dianhydride, cyclopentanetetracarboxylic acid, cyclopentanetetracarboxylic esters, cyclopentanetetracarboxylic dianhydrides, and bicyclopentanetetracarboxylic dianhydrides. Of these, the tetracarboxylic acid component preferably contains at least one selected from the group consisting of cyclohexanetetracarboxylic dianhydride, cyclobutanetetracarboxylic dianhydride, and cyclopentanetetracarboxylic dianhydride, and more preferably contains cyclohexanetetracarboxylic dianhydride. The various tetracarboxylic acid components described above include a positional isomer.

More preferred specific examples of the tetracarboxylic acid component described above include 1,2,4,5-cyclohexanetetracarboxylic acid, 1,2,4,5-cyclohexanetetracarboxylic dianhydride, 1,2,4,5-cyclohexanetetracarboxylic acid methyl ester, 1,2,3 4-butanetetracarboxylic acid, 1,2,3,4-butanetetracarboxylic dianhydride, 1,2,3,4-butanetetracarboxylic acid methyl ester, 1,2,3,4-cyclobutanetetracarboxylic acid, 1,2,3,4-cyclobutanetetracarboxylic dianhydride, 1,2,3 4-cyclobutanetetracarboxylic acid methyl ester, 1,2,4,5-cyclopentanetetracarboxylic acid, 1,2,4,5-cyclopentanetetracarboxylic dianhydride, 1,2,4,5-cyclopentanetetracarboxylic acid methyl ester, 3-carboxymethyl-1,2,4-cyclopentanetricarboxylic acid, bicyclo[2.2.2]octa-7-ene-2,3,5,6-tetracarboxylic acid, bicyclo[2.2.2]octa-7-ene-2,3,5,6-tetracarboxylic dianhydride, bicyclo[2.2.2]octa-7-ene-2,3,5,6-tetracarboxylic acid methyl ester, dicyclohexyltetracarboxylic acid, dicyclohexyltetracarboxylic dianhydride, and dicyclohexyltetracarboxylic acid methyl ester.

Among these, the tetracarboxylic acid component preferably contains at least one selected from the group consisting of 1,2,4,5-cyclohexanetetracarboxylic acid, 1,2,4,5-cyclohexanetetracarboxylic dianhydride, 1,2,3,4-cyclobutanetetracarboxylic dianhydride, and 1,2,4,5-cyclohexanetetracarboxylic acid methyl ester, because they advantageously facilitate increase in molecular weight in production of the polyimide resin and easily provide a flexible resin film.

The tetracarboxylic acid component may include other tetracarboxylic acids or derivatives thereof as long as the flexibility and thermocompression bonding property of the resin film are not impaired. Examples of these other tetracarboxylic acids or derivatives thereof include at least one selected from the group consisting of pyromellitic acid, 3,3',4,4'-biphenyltetracarboxylic acid, 2,3,3',4'-biphenyltetracarboxylic acid, 2,2-bis(3,4-dicarboxyphenyl)propane, 2,2-bis(2,3-dicarboxyphenyl)propane, 2,2-bis(3,4-dicarboxyphenyl)-1,1,1,3,3,3-hexafluoropropane, 2,2-bis(2,3-dicarboxyphenyl)-1,1,1,3,3,3-hexafluoropropane, bis(3,4-dicarboxyphenyl)sulfone, bis(3,4-dicarboxyphenyl)ether, bis(2,3-dicarboxyphenyl)ether, 3,3',4,4'-benzophenone tetracarboxylic acid, 2,2',3,3'-benzophenone tetracarboxylic acid, 4,4-(p-phenylenedioxy)diphthalic acid, 4,4-(m-phenylenedioxy)diphthalic acid, ethylenetetracarboxylic acid, 1,1-bis(2,3-dicarboxyphenyl)ethane, bis(2,3-dicarboxyphenyl)methane, bis(3,4-dicarboxyphenyl)methane and derivatives thereof.

A light transmittance at a wavelength of 365 nm of the ring-closed polyimide resin (A) according to the present embodiment, when formed into a solution having a solid content concentration of 3 mass %, is preferably 80% or greater, more preferably 85% or greater, further preferably 88% or greater, and even further preferably 90% or greater, from the perspective of more uniformly crosslinking the resin film and further improving thick-film curability and thick-film patternability.

<Method for Producing Ring-Closed Polyimide Resin (A)>

The ring-closed polyimide resin (A) according to the present embodiment can be produced by a production method including the following steps (1) and (2):

Step (1): a tetracarboxylic acid component and a diamine component are reacted to produce a polyimide resin having an amino group in its terminal end.

Step (2): the polyimide resin having an amino group at the terminal end produced in step (1), the functional group-containing compound (a compound having an isocyanate group or an epoxy group and a (meth)acryl group) are reacted.

(Step (1))

Step (1): a tetracarboxylic acid and a diamine component are reacted to produce a polyimide resin having an amino group at its terminal end.

An organic solvent used when the tetracarboxylic acid component and the diamine component are reacted is not particularly limited, but an organic solvent containing at least one type selected from the group consisting of cyclic ethers, cyclic ketones, cyclic esters, amides and ureas is preferable. Specific examples of suitable solvents include, but are not limited to, at least one type selected from the group consisting of aprotic polar organic solvents such as γ-butyrolactone, N,N-dimethylacetamide, N,N-dimethylformamide, N-methyl-2-pyrrolidone, dimethyl sulfoxide, hexamethylphosphoramide, cyclopentanone, cyclohexanone, 1,3-dioxolane, 1,4-dioxane, tetramethylurea and tetrahydrofuran. Among these, the solvent may be preferably one or more types selected from the group consisting of γ-butyrolactone, N,N-dimethylacetamide, N,N-dimethylformamide, and N-methyl-2-pyrrolidone.

When the tetracarboxylic acid component and the diamine component are reacted in step (1), an imidization catalyst can be used. As the imidization catalyst, a tertiary amine compound is preferable, and specifically, at least one selected from the group consisting of trimethylamine, triethylamine, tripropylamine, tributylamine, triethanolamine, N,N-dimethylethanolamine, N,N-diethylethanolamine, triethylenediamine, N-methylpyrrolidine, N-ethylpyrrolidine, N-methylpiperidine, N-ethylpiperidine, imidazole, pyridine, quinoline and isoquinoline can be used.

A reaction temperature in step (1) is, for example, in a range of 160° C. or higher and 230° C. or lower, preferably in a range of 170° C. or higher and 210° C. or lower, and more preferably in a range of 180° C. or higher and 200° C. or lower. When the reaction temperature in step (1) is the lower limit or higher, imidization and increase in molecular weight can be more effectively progressed. When the reaction temperature in step (1) is the upper limit or lower, the solution viscosity can be appropriately maintained, and defects such as charring of the resin on the wall of a reaction vessel can be further avoided. In some cases, azeotropic dehydrating agents such as toluene and xylene may be used. The reaction pressure is usually normal pressure, but if necessary, the reaction can be carried out under pressure. A holding time of the reaction temperature is preferably 1 hour or longer, and more preferably 3 hours or longer. When the holding time of the reaction temperature is the lower limit or longer, imidization and increase in molecular weight can be more effectively progressed. The upper limit of the reaction time is not particularly limited, and is performed in the range of 10 hours or shorter.

In step (1), "A mol" of the tetracarboxylic acid component and "B mol" of the diamine component are reacted preferably in a range of 0.80≤A/B≤0.99, and more preferably in a range of 0.85≤A/B≤0.97. When A/B≤0.99, the terminal end of the polyimide can be made into a diamine in excess, a polyimide resin having an amino group at a terminal end can be formed, and a polyimide resin having a molecular weight which satisfies sufficient developer solubility can be produced. When 0.80≤A/B, a polyimide resin having a molecular weight that realizes sufficient flexibility can be produced.

As the ratio A/B approaches 1.0, a polyimide resin having a high molecular weight can be formed. Therefore, when the ratio A/B is adjusted appropriately, a polyimide resin having a target molecular weight can be produced.

<Step (2)>

Step (2) is a step of modifying the terminal end of the polyimide resin produced in step (1). Specifically, as described above, the polyimide and the functional group-containing compound described above (a compound having an isocyanate group or epoxy group and a (meth)acryl group) is reacted to produce a polyimide resin having a (meth)acryl group at the terminal end.

The functional group-containing compound that modifies the terminal end of the polyimide resin is a compound having an isocyanate group or an epoxy group and a (meth)acryl group. Specific examples include 2-isocyanatoethyl methacrylate, 2-isocyanatoethyl acrylate, 1,1-bis(acryloyloxymethyl)ethyl isocyanate, glycidyl methacrylate, glycidyl acrylate, and allyl glycidyl ether. These functional group-containing compounds may be used alone or in combination of two or more. The functional group-containing compound is preferably used at a ratio from 0.1 to 30 molar ratio with respect to a polyimide resin having an amino group at a terminal end.

A reaction temperature in step (2) is preferably in a range of 30° C. or higher and 100° C. or lower, and a reaction time is preferably 1 hour or longer and 10 hours or shorter.

When the amino group terminal of the polyimide resin is reacted with the isocyanate group or epoxy group of the functional-group-containing compound, the reaction may be carried out as-is or, if necessary, in the presence of a catalyst. Examples of the catalyst include amine compounds such as triethylamine, organic phosphorus compounds such as triphenylphosphine, and the like, and these may be used alone or in combination of two or more. A polymerization inhibitor may be used to inhibit side reactions during the reaction. Examples of polymerization inhibitors include hydroquinone, hydroquinone monomethylether, and methylhydroquinone, and these may be used alone or in combination of two or more.

A content of the ring-closed polyimide resin (A) in the photosensitive polyimide resin composition according to the present embodiment is preferably 30 mass % or greater, more preferably 40 mass % or greater, further preferably 50 mass % or greater, and even further preferably 60 mass % or greater, and preferably 90 mass % or less, more preferably 80 mass % or less, and further preferably 70 mass % or less based on 100 mass % of a total solid content of the photosensitive polyimide resin composition, from the perspective of further improving the thick-film patternability.

Here, in the present embodiment, the total solid content of the photosensitive polyimide resin composition is a component remaining as a solid content when the photosensitive polyimide resin composition is cured, and for example, a component volatilized by heating such as a solvent is excluded. On the other hand, even in the case of the liquid component, the component incorporated into the resin film when heated and cured is included in the total solid content.

[Polyfunctional Radically Polymerizable Compound (B)]

The polyfunctional radically polymerizable compound (B) according to the present embodiment has 3 or more and 100 or less radically polymerizable functional groups and oxyalkylene groups having a total number of added moles of 5 or greater and 100 or less.

Here, in the present embodiment, when the polyfunctional radically polymerizable compound (B) includes two or more polyfunctional radically polymerizable compounds having different numbers of radically polymerizable functional groups, the number of radically polymerizable functional groups of the polyfunctional radically polymerizable compound (B) can be a weighted average value of the numbers of radically polymerizable functional groups of the respective polyfunctional radically polymerizable compounds.

In this embodiment, when the polyfunctional radically polymerizable compound (B) contains two or more polyfunctional radically polymerizable compounds having different total numbers of moles of oxyalkylene groups added, the total number of moles of oxyalkylene groups added of the polyfunctional radically polymerizable compound (B) can be a weighted average value of the total numbers of moles of oxyalkylene groups added of the polyfunctional radically polymerizable compounds.

The number of radically polymerizable functional groups of the polyfunctional radically polymerizable compound (B) is 3 or greater and 100 or less, but, from the perspective of further improving the balance between thick-film heat resistance and thick-film flexibility, it is preferably 4 or greater, more preferably 5 or greater, and further preferably 6 or greater, and preferably 50 or less, further preferably 30 or less, even further preferably 15 or less, still even further preferably 10 or less, still even further preferably 8 or less, and still even further preferably 7 or less.

The total number of moles of oxyalkylene groups added of the polyfunctional radically polymerizable compound (B) is 5 or greater and 100 or less, but, from the perspective of further improving the balance between thick-film heat resistance and thick-film flexibility, it is preferably 6 or greater, more preferably 8 or greater, and further preferably 10 or greater, and preferably 90 or less, further preferably 80 or less, even further preferably 70 or less, and still even further preferably 65 or less.

From the perspective of further improving the balance between thick-film heat resistance and thick-film flexibility, the oxyalkylene group of the polyfunctional radically polymerizable compound (B) preferably contains at least one selected from the group consisting of an oxyethylene group and an oxypropylene group, and more preferably contains an oxyethylene group.

From the viewpoints of further improving the balance between thick-film heat resistance and thick-film flexibility, the number average molecular weight of the polyfunctional radically polymerizable compound (B) is preferably 500 or greater, more preferably 600 or greater, further preferably 800 or greater, and even further preferably 1000 or greater, and preferably 10000 or less, more preferably 8000 or less, and further preferably 5000 or less.

Examples of the radically polymerizable functional group include a (meth)acryloyl group and a vinyl group, and a (meth)acryloyl group is preferable.

Examples of the polyfunctional radically polymerizable compound forming the polyfunctional radically polymerizable compound (B) include polypropylene glycol di(meth) acrylate, ethoxylated trimethylolpropane tri(meth)acrylate, propoxylated trimethylolpropane tri(meth)acrylate, ethoxylated pentaerythritol tetra(meth)acrylate, propoxylated pentaerythritol tetra(meth)acrylate, ethoxylated pentaerythritol tri(meth)acrylate, propoxylated pentaerythritol tri(meth) acrylate, ethoxylated tris-(2-(meth)acryloxyethyl) isocyanurate, propoxylated tris-(2-(meth)acryloxyethyl) isocyanurate, ethoxylated ditrimethylolpropane tetra(meth)acrylate, propoxylated ditrimethylolpropane tetra(meth)acrylate, ethoxylated ditrimethylolpropane penta(meth)acrylate, propoxylated ditrimethylolpropane penta(meth)acrylate, ethoxylated ditrimethylolpropane hexa(meth)acrylate, propoxylated ditrimethylolpropane hexa(meth)acrylate, ethoxylated dipentaerythritol penta(meth)acrylate, propoxylated dipentaerythritol penta(meth)acrylate, ethoxylated dipentaerythritol hexa(meth)acrylate, propoxylated dipentaerythritol hexa(meth)acrylate, ethoxylated tripentaerythritol (meth)acrylate, propoxylated tripentaerythritol (meth) acrylate, ethoxylated glycerin (meth)acrylate, propoxylated glycerin (meth)acrylate, ethoxylated diglycerin (meth)acrylate, propoxylated diglycerin (meth)acrylate, ethoxylated triglycerin (meth)acrylate, propoxylated triglycerin (meth) acrylate, ethoxylated polyglycerin-based (meth)acrylate, and propoxylated polyglycerin-based (meth)acrylate. These polyfunctional radically polymerizable compounds may be used alone or in combination of two or more. These polyfunctional radically polymerizable compounds may be used alone to adjust the number of radically polymerizable functional groups and the total number of moles of oxyalkylene groups added to fall within the above ranges, or may be used in combination of two or more to adjust the number of radically polymerizable functional groups and the total number of moles of oxyalkylene groups added to fall within the above ranges.

Here, the ethoxylated or propoxylated polyglycerin-based (meth)acrylate refers to a compound having a polyglycerin skeleton and a (meth)acryloyl group. Examples of the ethoxylated or propoxylated polyglycerin-based (meth)acrylate include SA-TE6 and SA-TE60 available from Sakamoto Yakuhin Kogyo Co., Ltd.

A content of the polyfunctional radically polymerizable compound (B) in the photosensitive polyimide resin composition according to the present embodiment is preferably 20 parts by mass or greater, more preferably 30 parts by mass or greater, and further preferably 40 parts by mass or greater from the perspective of further improving the balance between thick-film heat resistance and thick-film flexibility, and preferably 100 parts by mass or less, more preferably 90 parts by mass or less, further preferably 80 parts by mass or less, even further preferably 70 parts by mass or less, and still even further preferably 60 parts by mass or less from the perspective of further suppressing stickiness of the thick-film pattern while further improving the balance between thick-film heat resistance and thick-film flexibility, when the amount of the ring-closed polyimide resin (A) contained in the photosensitive polyimide resin composition is 100 parts by mass.

[Additional Component]

The photosensitive polyimide resin composition according to the present embodiment preferably further contains, for example, at least one selected from the group consisting of a photopolymerization initiator, a solvent, an adhesion improver, a surface conditioner, and a sensitizer, and more preferably further contains at least one selected from the group consisting of a photopolymerization initiator and a solvent, as an additional component other than the ring-closed polyimide resin (A) and the polyfunctional radically polymerizable compound (B).

(Photopolymerization Initiator)

The photopolymerization initiator is not particularly limited, and a known photopolymerization initiator can be used. Examples thereof include 2,2-dimethoxy-1,2-diphenylethan-1-one, 1-hydroxycyclohexylphenyl ketone, 2-hydroxy-2-methyl-1-phenyl-propan-1-one, 1-[4-(2-hydroxyethoxy)-phenyl]-2-hydroxy-2-methyl-1-propan-1-one, 2-hydroxy-1-{4-[4-(2-hydroxy-2-methyl-propionyl)-benzyl] phenyl}-2-methyl-propan-1-one, 2-methyl-1-(4-methylthiophenyl)-2-morpholinopropan-1-one, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone, 2,4,6-trimethylbenzoyl-diphenylphosphine oxide, and bis(2,4,6-trimethylbenzoyl)phenylphosphine oxide. The photopolymerization initiator may be used alone or in combination of two or more.

Further, a content of the photopolymerization initiator in the photosensitive polyimide resin composition according to the present embodiment is, for example, 0.1 parts by mass or greater and 10 parts by mass or less when the amount of the ring-closed polyimide resin (A) contained in the photosensitive polyimide resin composition is 100 parts by mass.

(Solvent)

The solvent is preferably an aprotic polar solvent from the perspective of solubility. Examples of the solvent include N-methyl-2-pyrrolidone, N-acetyl-2-pyrrolidone, N-benzyl-2-pyrrolidone, N,N-dimethylformamide, N,N-dimethylacetamide, dimethyl sulfoxide, hexamethylphosphortriamide, N-acetyl-ε-caprolactam, dimethylimidazolidinone, diethylene glycol dimethyl ether, triethylene glycol dimethyl ether, and γ-butyrolactone. These solvents may be used alone or in combination of two or more. To further improve the applicability, solvents such as toluene, xylene, diethyl ketone, methoxybenzene, cyclopentanone, and the like may be mixed in a range that does not adversely affect the solubility of the polymer.

The use of an appropriate solvent can facilitate use of the photosensitive polyimide resin composition according to the present embodiment in a solution (varnish) state, and can improve film formability.

(Adhesion Improver)

The adhesion improver is not particularly limited, and a known adhesion improver may be used. Examples of usable adhesion improvers include known coupling agents such as a silane coupling agent, a titanate coupling agent and an aluminate coupling agent. Examples of the silane coupling agents include an amino group-containing silane coupling agent, an epoxy group-containing silane coupling agent, a mercapto group-containing silane coupling agent, and a (meth)acrylic group-containing silane coupling agent. Examples of the coupling agents include KP-390, KA-1003, KBM-1003, KBE-1003, KBM-303, KBM-403, KBE-402, KBE-403, KBM-1403, KBM-502, KBM-503, KBE-502, KBE-503, KBM-5103, KBM-602, KBM-603, KBE-603, KBM-903, KBE-903, KBE-9103, KBM-9103, KBM-573, KBM-575, KBM-6123, KBE-585, KBM-703, KBM-802, KBM-803, KBE-846, and KBE-9007 (all trade names; available from Shin-Etsu Chemical Co., Ltd.). These coupling agents may be used alone or in combination of two or more.

Further, a content of the adhesion improver in the photosensitive polyimide resin composition according to the present embodiment is preferably 0.0005 parts by mass or greater and 20 parts by mass or less when the amount of the ring-closed polyimide resin (A) contained in the photosensitive polyimide resin composition is 100 parts by mass.

(Surface Conditioner)

The surface conditioner is not particularly limited, and a known surface conditioner can be used. Examples of usable surface conditioners include various surface conditioners such as a silicon-based surface conditioner, an acrylic surface conditioner, a fluorine-based surface conditioner, a nonionic surface conditioner, a cationic surface conditioner, and an anionic surface conditioner. These surface conditioners may be used alone, or in combination of two or more.

Further, a content of the surface conditioner in the photosensitive polyimide resin composition according to the present embodiment is preferably 0.001 parts by mass or greater and 20 parts by mass or less when the amount of the ring-closed polyimide resin (A) contained in the photosensitive polyimide resin composition is 100 parts by mass.

(Sensitizer)

The sensitizer is not particularly limited, and a known sensitizer can be used. Examples include an amino group-containing sensitizer, and preferably a compound having an amino group and a phenyl group in the same molecule. More specifically, examples thereof include benzophenone-based compounds such as 4,4'-dimethylaminobenzophenone, 4,4'-diethylaminobenzophenone, 2-aminobenzophenone, 4-aminobenzophenone, 4,4'-diaminobenzophenone, 3,3'-diaminobenzophenone, 3,4-diaminobenzophenone; p-dialkylaminophenyl group-containing compounds such as 2-(p-dimethylaminophenyl)benzoxazole, 2-(p-diethylaminophenyl)benzoxazole, 2-(p-dimethylaminophenyl)benzo[4,5]benzoxazole, 2-(p-dimethylaminophenyl)benzo[6,7]benzoxazole, 2,5-bis(p-diethylaminophenyl)-1,3,4-oxadiazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl)-1,3,4-thiadiazole, (p-dimethylaminophenyl)pyridine, (p-diethylaminophenyl)pyridine, (p-dimethylaminophenyl)quinoline, (p-diethylaminophenyl)quinoline, (p-dimethylaminophenyl)pyrimidine, and (p-diethylaminophenyl)pyrimidine. These sensitizers may be used alone or in combination of two or more.

Further, a content of the sensitizer in the photosensitive polyimide resin composition according to the present embodiment is preferably 0.001 parts by mass or greater and 10 parts by mass or less when the amount of the ring-closed polyimide resin (A) contained in the photosensitive polyimide resin composition is 100 parts by mass.

When the photosensitive polyimide resin composition according to the present embodiment is formed into a resin film having a thickness of 30 μm, the elongation rate at break is preferably 8% or greater, more preferably 10% or greater, further preferably 12% or greater, and even further preferably 15% or greater, from the perspective of further improving thick-film heat resistance. An upper limit of the elongation rate at break is not particularly limited, and is, for example, 200% or less, preferably 150% or less, and further preferably 100% or less.

The resin film having a thickness of 30 μm is a resin film produced by the following method.

First, the photosensitive polyimide resin composition according to the present embodiment is applied onto a substrate such as a silicon wafer so that the film thickness after solvent removal is 30 μm. Then, the photosensitive polyimide resin composition formed on the substrate is prebaked (dried) at 100° C. for 5 minutes, and then exposed to light irradiated from a high-pressure mercury lamp, with wavelengths of less than 365 nm being cut off, at an optimum exposure amount within a range of an integrated irradiation amount (calculated from the illuminance at 365 nm) of 250 mJ/$cm^2$ or greater and 5000 mJ/$cm^2$ or less. After allowed to stand at room temperature for 15 minutes, it is immersed in water, the resin film is peeled off from the substrate, and heat-treated under the conditions: at 200° C. for 2 hours in a nitrogen atmosphere.

In the present embodiment, the optimum exposure amount is an integrated irradiation amount that actually provides the best balance among thick-film curability, thick-film flexibility, and thick-film heat resistance, when exposure is performed at a plurality of different integrated irradiation amounts (five points of 250 mJ/$cm^2$, 1500 mJ/$cm^2$, 2000 mJ/$cm^2$, 4000 mJ/$cm^2$, and 5000 mJ/$cm^2$) within the range of 250 mJ/$cm^2$ or greater and 5000 mJ/$cm^2$ or less. Here, in the present embodiment, the phrase "excellent thick-film curability" means that, when the thickness of the resin film is set to be large, for example, 20 μm or greater, a self-supporting film is formed and solubility in a developer (for example, γ-butyrolactone) is low.

When the photosensitive polyimide resin composition according to the present embodiment is formed into a resin film having a thickness of 30 μm, the glass transition temperature is preferably 180° C. or higher, more preferably 190° C. or higher, further preferably 200° C. or higher, even further preferably 210° C. or higher, and still even further preferably 230° C. or higher, from the perspective of further improving thick-film heat resistance. An upper limit of the glass transition temperature is not particularly specified, but is, for example, 300° C. or lower, and preferably 280° C. or lower. The glass transition temperature can be given by thermomechanical analysis (TMA).

The resin film having a thickness of 30 μm is a resin film produced by the following method.

First, the photosensitive polyimide resin composition according to the present embodiment is applied onto a substrate such as a silicon wafer so that the film thickness after solvent removal is 30 μm. Then, the photosensitive polyimide resin composition formed on the substrate is prebaked (dried) at 100° C. for 5 minutes, and then exposed to light irradiated from a high-pressure mercury lamp, with wavelengths of less than 365 nm being cut off, at an optimum exposure amount within a range of an integrated irradiation amount (calculated from the illuminance at 365 nm) of 250 mJ/$cm^2$ or greater and 5000 mJ/$cm^2$ or less. After allowed to stand at room temperature for 15 minutes, it is immersed in water, the resin film is peeled off from the substrate, and heat-treated under the conditions: at 200° C. for 2 hours in a nitrogen atmosphere.

In the present embodiment, the optimum exposure amount is an integrated irradiation amount that actually provides the best balance among thick-film curability, thick-film flexibility, and thick-film heat resistance, when exposure is performed at a plurality of different integrated irradiation amounts (five points of 250 mJ/$cm^2$, 1500 mJ/$cm^2$, 2000 mJ/$cm^2$, 4000 mJ/$cm^2$, and 5000 mJ/$cm^2$) within the range of 250 mJ/$cm^2$ or greater and 5000 mJ/$cm^2$ or less.

The photosensitive polyimide resin composition according to the present embodiment is not particularly limited, and can be produced, for example, by mixing at least one selected from the group consisting of a photopolymerization initiator, a solvent, an adhesion improver, a surface conditioner, and a sensitizer, as necessary, with the ring-closed polyimide resin (A) and the polyfunctional radically polymerizable compound (B).

2. Resin Film

The photosensitive polyimide resin composition according to the present embodiment can be used, for example, to form a resin film such as a resist or a permanent film forming an electronic device (cured film) used in manufacturing an electronic device. That is, the resin film according to the present embodiment is formed of a photosensitive polyimide resin composition or a cured product of the photosensitive polyimide resin composition.

The resist is formed of, for example, a resin film produced by coating the photosensitive polyimide resin composition according to the present embodiment on a substrate and removing a solvent as necessary.

The permanent film is formed of a cured film produced by exposing and developing the resin film, patterning the resin film into a desired shape, and then curing the resin film by a heat treatment or the like.

The permanent film can be suitably used as, for example, an insulating film such as a surface protective film or an interlayer insulating film.

The surface protective film refers to an insulating film formed on a surface of an electronic component or an electronic device or a surface of wiring of a wiring board to protect the surface, and a type of the surface protective film is not particularly limited. Examples of such a surface protective film include a passivation film or a buffer coat layer provided on a semiconductor element, and a cover coat provided on a flexible substrate.

The interlayer insulating film refers to an insulating film provided in a multilayer structure, and the type thereof is not particularly limited. Examples of the interlayer film include an interlayer film used in semiconductor device applications such as an interlayer insulating film constituting a multilayer wiring structure of a semiconductor element, and a build-up layer or a core layer constituting a wiring board. In addition, examples of the interlayer film include those used in display device applications such as a planarization film covering a thin film transistor in a display device, a liquid crystal alignment film, a protrusion provided on a color filter substrate of a liquid crystal display device, or a partition wall for forming a cathode of an organic EL element.

The method of applying the photosensitive polyimide resin composition according to the present embodiment onto the substrate is not particularly limited, and examples thereof include ink jet methods, spin coating methods, casting methods, microgravure methods, gravure coating methods, bar coating methods, roll coating methods, wire bar coating methods, dip coating methods, spray coating methods, screen printing methods, flexographic printing methods, and die coating methods.

When the photosensitive polyimide resin composition according to the present embodiment is applied onto the substrate, the solid content concentration thereof is preferably adjusted to fall within a range of 5 mass % or greater and 50 mass % or less. The solvent used during application is preferably an aprotic polar solvent from the perspective of solubility. Specifically, suitable examples include N-methyl-2-pyrrolidone, N-acetyl-2-pyrrolidone, N-benzyl-2-pyrrolidone, N,N-dimethylformamide, N,N-dimethylacetamide, dimethyl sulfoxide, hexamethylphosphortriamide, N-acetyl-ε-caprolactam, dimethylimidazolidinone, diethylene glycol dimethyl ether, triethylene glycol dimethyl ether, and γ-butyrolactone. These solvents may be used alone or in combination of two or more. To further improve the applicability, solvents such as toluene, xylene, diethyl ketone, methoxybenzene, and cyclopentanone may be mixed in a range that does not adversely affect the solubility of the polymer.

Examples of the substrate include glass, silicon wafer, metal foil, and plastic film. Among the substrates above, a silicon wafer and copper foil are preferable.

The exposure of the film can be carried out, for example, by irradiating a film composed of the photosensitive polyimide resin composition formed on the substrate with light (usually, ultraviolet rays are used) through a photomask having a predetermined pattern. The exposed film has a portion where light is blocked by the photomask and a portion irradiated with light, that is, an exposed portion and an unexposed portion. In the exposed portion of the exposed film, the polyimide resin in the photosensitive polyimide resin composition is cross-linked, a cross-linked polyimide film is formed, and a pattern is formed by the subsequent development step. On the other hand, in the unexposed portion, the polyimide resin is not crosslinked, and thus it forms an uncrosslinked polyimide film which is dissolved and removed by development.

After irradiation, an unexposed portion can be dissolved and removed by a developer to form a desired relief pattern.

An ultraviolet ray irradiation amount is preferably 100 $mJ/cm^2$ or greater and 8000 $mJ/cm^2$ or less, and more preferably 200 $mJ/cm^2$ or greater and 6000 $mJ/cm^2$ or less in terms of integrated irradiation amount.

In the method for forming a resin pattern using the photosensitive polyimide resin composition according to the present embodiment, an organic solvent is preferably used as the developer. The developer is not particularly limited as long as it can dissolve the photosensitive polyimide resin composition according to the present embodiment. Specifically, suitable examples include N-methyl-2-pyrrolidone, N-acetyl-2-pyrrolidone, N-benzyl-2-pyrrolidone, N,N-dimethylformamide, N,N-dimethylacetamide, dimethyl sulfoxide, hexamethylphosphortriamide, N-acetyl-ε-caprolactam, dimethylimidazolidinone, diethylene glycol dimethyl ether, triethylene glycol dimethyl ether, and γ-butyrolactone.

These developers may be used alone or in combination of two or more.

The relief pattern formed by the development is then washed with a rinse solution to remove the developer. Suitable examples of the rinse solution include methanol, ethanol, isopropyl alcohol, and water, which are miscible with the developer.

The relief pattern formed by the process described above is heated at a temperature selected from a range of 80° C. or higher and 250° C. or lower, the solvent is dried, and then, a cured film (pattern) formed by curing the photosensitive polyimide resin composition according to the present embodiment can be produced. According to this embodiment, the resultant relief pattern can be formed at a high resolution, because the photosensitive polyimide resin composition is used that has excellent characteristics in development, that is, the exposed portion is sufficiently cured and the unexposed portion is sufficiently removed.

A thickness of the resin film according to the present embodiment is preferably 20 μm or greater, more preferably 25 μm or greater, and further preferably 30 μm or greater, and is preferably 85 μm or less, and more preferably 60 μm or less. When the film thickness is within the range described above, it can be used as an excellent insulating film. When the film thickness is larger (i.e., the amount of the photosensitive polyimide resin composition applied onto the substrate increases), the developer solubility of the polyimide resin often becomes particularly problematic. However, according to the present invention, the ring-closed polyimide resin (A) having a specific structure and a specific terminal structure and also having a specific molecular weight range is used, and thus excellent developer solubility and transparency can be achieved also in such a case.

Therefore, the resin film according to the present embodiment can be suitably used, for example, in an insulating film application where the application of high voltage is assumed. The resin film formed from the photosensitive polyimide resin composition of the present embodiment containing the ring-closed polyimide resin (A) and the polyfunctional radically polymerizable compound (B) can effectively suppress occurrence of cracking and the like, and is excellent in physical properties.

3. Electronic Device

The electronic device according to the present embodiment includes a resin film according to the present embodiment.

The electronic device according to the present embodiment is not particularly limited as long as the electronic device includes a resin film formed of a photosensitive polyimide resin composition according to the present embodiment, and examples thereof include a display device having the resin film according to the present embodiment as a flattening film or a microlens; a semiconductor device including a multilayer wiring structure using the resin film according to the present embodiment as an interlayer insulating film; a semiconductor device using the resin film according to the present embodiment as a surface protective film of a semiconductor element or a wiring substrate; and a semiconductor device using the resin film according to the present embodiment as a build-up layer or a core layer forming a wiring board. Among them, a semiconductor device is preferable as the electronic device according to the present embodiment.

The electronic device according to the present embodiment can be manufactured on the basis of known information except for using the resin film according to the present embodiment.

The electronic device according to the present embodiment includes a resin film having an excellent balance between thick-film heat resistance and thick-film flexibility, and thus is less likely to cause dielectric breakdown or the like, and is excellent in reliability.

EXAMPLES

The present invention will be described in further detail hereinafter using examples and comparative examples, but the present invention is not limited to the following examples.

<Evaluation>

The evaluation methods employed in the examples and comparative examples are as follows.

(1) Weight Average Molecular Weight (Mw)

Mw was determined by GPC analysis. The apparatuses used in the analysis and the analysis conditions are as follows.

- Apparatus: Ecosec Elite HLC8420GPC (available from Tosoh Corporation)
- Column: TSKgel SuperAWM-H (column size: 6.0 mm×15 cm, packed gel particle size: 9 μm)×2 (available from Tosoh Corporation)
- Eluent: (20 mM Lithium bromide and 100 mM phosphoric acid) added dimethylformamide
- Standard polystyrene: PStQuick Kit-H (available from Tosoh Corporation)
- Flow rate: 0.6 mL/min
- Column temperature: 40° C.
- Detector: RI (refractive index detector)

(2) Patterning

A photosensitive polyimide resin composition varnish was prepared in each of the Examples and Comparative Examples which will be described below. The varnish prepared in each of the Examples and Comparative Examples was applied to a silicon wafer using a spin coater so that the film thickness after solvent removal was 30 μm, and then heated at 100° C. for 5 minutes to remove the solvent. The varnish applied onto the silicon wafer was exposed by a predetermined amount using a mask aligner and allowed to stand at room temperature for 15 minutes. Thereafter, γ-butyrolactone as a developer was sprayed for 30 seconds to remove an unexposed portion, washing was performed using methanol as a rinse solution, and the solvent was removed under air circulation.

The apparatuses and conditions used during the exposure were as follows.

- Mask aligner: MA-10B (available from Mikasa Co., Ltd.)
- Light source: high-pressure mercury lamp
- Illuminance: 12 $W/cm^2$ (wavelength: 365 nm)
- Integrated irradiation amount: From 250 to 5000 $mJ/cm^2$
- Developer: γ-butyrolactone
- Rinse solution: methanol
- Silicon wafer: 4-inch silicon wafer (available from Advantec Co., Ltd.)

(3) Evaluation of Thick-Film Developability

The pattern (line/space=30 μm/30 μm pattern or 30 μm/150 μm pattern) formed in the above (2) was cut, and the cross section was observed with SEM (TM3030plus (available from Hitachi, Ltd.)) to confirm the presence or absence of residue in a space portion (unexposed portion). A case where no residue was present in the space portion was evaluated as "Good", and a case where a residue was present in the space portion was evaluated as "Poor".

(4) Light Transmittance

The ring-closed polyimide resin (A) formed in each of synthesis examples was dissolved in γ-butyrolactone to produce a polyimide resin solution having a solid content concentration of 3 mass %. Next, the light transmittance of the polyimide resin solution at a wavelength of 365 nm was measured using a spectrophotometer "product name: U3900H" available from Hitachi, Ltd. and a cell having an optical path length of 10 mm.

(5) Elongation Rate at Break and Glass Transition Temperature

A photosensitive polyimide resin composition varnish was prepared in each of the Examples and Comparative Examples which will be described below. The varnish prepared in each of the Examples and Comparative Examples was applied to a silicon wafer using a spin coater so that the film thickness after solvent removal was 30 μm, and then heated at 100° C. for 5 minutes to remove the solvent. The varnish applied onto the silicon wafer was exposed by a predetermined amount using a mask aligner and allowed to stand at room temperature for 15 minutes. Thereafter, it was immersed in water, and the resin film was peeled off from the silicon wafer and baked at 200° C. for 2 hours in a nitrogen atmosphere. The elongation rate at break and the glass transition temperature (Tg) of the resulting resin film were measured under the following conditions.

The apparatus used in the measurement of the elongation rate at break and the measurement conditions are as follows.

Universal tester: Autograph AGS-X10 kN (available from Shimadzu Corporation)

Tensile speed: 1 mm/min

Test piece size: dumbbell shape No. 6 (JIS K6251:2017), thickness: 30 μm

The apparatus used in the glass transition temperature measurement and the measurement conditions are as follows.

An inflection point during the second heating in the TMA measurement was taken as Tg.

Thermomechanical analyzer: TMASS6100 (available from Hitachi High-Tech Science Corporation)

Load: 100 mN

Temperature condition: 30° C.→from 220 to 300° C.→30° C.→300° C.

Temperature increase rate: from 5 to 10° C./min

<Production of Ring-Closed Polyimide Resin (A)>

Synthesis Example 1

Into a 500 mL five-necked flask equipped with a nitrogen introducing tube, a stirrer, a thermometer, and a condenser, 215.8492 g (0.642 mol) of 4,4'-oxybis[3-(trifluoromethyl) benzenamine], 3.083 g (0.030 mol) of triethylamine, and 430.5 g of γ-butyrolactone (hereinafter, GBL) were placed under nitrogen, and heated to 70° C. with stirring. Next, 136.6360 g (0.609 mol) of 1,2,4,5-cyclohexantetracarboxylic dianhydride was added to this mixture, and reacted for 5 hours at 190° C. The mixture was diluted with 339.1 g of GBL to produce 1069 g of a polyimide vanish having a solid content concentration of 30 mass %. As a result of measurement by GPC, the weight average molecular weight of the resulting polyimide in terms of polystyrene was 34046.

Next, into a 500 mL four-necked flask equipped with a stirrer, a thermometer, and a condenser, 300.56 g of the resulting polyimide varnish and 7.7102 g of 2-isocyanatoethyl acrylate (Karenz AOI available from Showa Denko K.K.) were placed, and reacted at 50° C. for 5 hours. Thereafter, the reaction liquid was dropped into water, and the polyimide was deposited, dried overnight at 70° C., and a ring-closed polyimide resin (Al) was produced. The resulting ring-closed polyimide resin (Al) had a weight average molecular weight of 34664 in terms of polystyrene. The resulting ring-closed polyimide resin (Al) had a light transmittance of 92.0% at a wavelength of 365 nm.

Examples and Comparative Examples

Example 1

In 10.0 g of GBL, 8.1 g of the ring-closed polyimide resin (Al) produced in Synthesis Example 1 was dissolved, and 4.065 g of ethoxylated polyglycerin-based acrylate (SA-TE60, available from Sakamoto Yakuhin Kogyo Co., Ltd.), 0.122 g of 1-hydroxycyclohexyl phenyl ketone (Omnirad 184, available from BASF), 0.285 g of bis(2,4,6-trimethylbenzoyl)phenylphosphine oxide (Omnirad 819, available from BASF), and 0.008 g of a silicone-containing polymer (LE-304, available from Kyoeisha Chemical Co., Ltd., silicon-based surface conditioner) as a surface conditioner were added and stirred until dissolved to produce a photosensitive polyimide resin composition varnish. The photosensitive polyimide resin composition varnish was applied onto a silicon wafer so that the film thickness after drying was 30 μm, and dried at 100° C. for 5 minutes. Subsequently, the varnish applied onto the silicon wafer was exposed to light irradiated from a high-pressure mercury lamp, with wavelengths of less than 365 nm being cut off, at an integrated irradiation amount (calculated from the illuminance at 365 nm) of 250 mJ/$cm^2$ by a mask aligner (MA-10B, available from Mikasa Co., Ltd.), and allowed to stand for 15 minutes. The cured resin film was peeled off from the silicon wafer, and the elongation rate at break and Tg were each measured. When the thick-film developability was evaluated, 0.004 g of KP-390 (available from Shin-Etsu Chemical Co., Ltd., coating additive) was further added, as an adhesion improver, to the photosensitive polyimide resin composition varnish. The results are shown in Table 1.

Examples 2 to 7 and Comparative Examples 1 to 3

Photosensitive resin compositions were prepared in the same manner as in Example 1, except that the type of polyfunctional radically polymerizable compound was changed to the compounds shown in Table 1 below and that the integrated irradiation amount was changed to the values shown in Table 1 below, and the characteristics thereof were evaluated. The results are shown together in Table 1.

However, in the Examples and Comparative Examples, the integrated irradiation amount (exposure amount) adopted was an integrated irradiation amount that provided the best balance among thick-film curability, thick-film flexibility, and thick-film heat resistance, when exposure was performed at a plurality of different integrated irradiation amounts (five points of 250 mJ/$cm^2$, 1500 mJ/$cm^2$, 2000 mJ/$cm^2$, 4000 mJ/$cm^2$, and 5000 mJ/$cm^2$) within the range of 250 mJ/$cm^2$ or greater and 5000 mJ/$cm^2$ or less.

TABLE 1

| | Compound name | Product name | Source of supply | Number of radically polymerizable functional groups [pieces] | Molecular weight | Total number of moles of oxyalkylene groups added | Integrated irradiation amount [mJ/$cm^2$] | Elongation rate at break [%] | Tg [° C.] | Developability 30 μm/30 μm pattern | Developability 30 μm/150 μm pattern |
|---|---|---|---|---|---|---|---|---|---|---|---|
| Example 1 | Ethoxylated polyglycerin-based acrylate | SA-TE60 | Sakamoto Yakuhin Kogyo Co., Ltd. | 6 | 3278 | 60 | 250 | 84.9 | 262 | Good | Good |
| Example 2 | Ethoxylated trimethylolpropane triacrylate | SR499 | Sartomer | 3 | 560 | 6 | 5000 | 8.9 | 212 | — | Good |
| Example 3 | Ethoxylated trimethylolpropane triacrylate | SR502 | Sartomer | 3 | 692 | 9 | 5000 | 14.2 | 200 | — | Good |

TABLE 1-continued

| | Compound name | Product name | Source of supply | Number of radically polymerizable functional groups [pieces] | Molecular weight | Total number of moles of oxyalkylene groups added | Integrated irradiation amount [mJ/cm$^2$] | Elongation rate at break [%] | Tg [° C.] | Developability 30 μm/30 μm pattern | Developability 30 μm/150 μm pattern |
|---|---|---|---|---|---|---|---|---|---|---|---|
| Example 4 | Ethoxylated trimethylolpropane triacrylate | SR9035 | Sartomer | 3 | 956 | 15 | 5000 | 22.5 | 187 | — | Good |
| Example 5 | Ethoxylated ditrimethylolpropane tetraacrylate | — | Mitsubishi Gas Chemical Company, Inc. | 4 | 1874 | 32 | 5000 | 15.4 | 190 | — | Good |
| Example 6 | Ethoxylated dipentaerythritol hexaacrylate | KAYARAD DPEA-12 | Nippon Kayaku Co., Ltd. | 6 | 1106 | 12 | 2000 | 17.1 | 214 | Good | Good |
| Example 7 | Ethoxylated polyglycerin-based acrylate | SA-TE6 | Sakamoto Yakuhin Kogyo Co., Ltd. | 6 | 902 | 6 | 1500 | 9.5 | 220 | Good | Good |
| Comparative Example 1 | Ethoxylated trimethylolpropane triacrylate | SR454 | Sartomer | 3 | 428 | 3 | 5000 | 7.0 | 221 | — | Good |
| Comparative Example 2 | Dipentaerythritol hexaacrylate | diPE-HA | Sigma-Aldrich | 6 | 547 | 0 | 4000 | 2.0 | 216 | Good | Good |
| Comparative Example 3 | Tripentaerythritol acrylate (mixture) | Viscoat 802 | Osaka Organic Chemical Industry Ltd. | 8 | 805 | 0 | 5000 | 1.2 | 277 | Good | Good |

As shown in Table 1, when the photosensitive polyimide resin compositions of the Examples were used, thick films having a thickness of 30 μm and had a high glass transition temperature and a high elongation rate at break were successfully produced as resin films. Further, when the photosensitive polyimide resin compositions of the Examples were used, patterns having no residue in the space portion were formed, and the photosensitive polyimide resin compositions of the Examples were excellent in thick-film developability. That is, the photosensitive polyimide resin compositions of the Examples were excellent in balance among thick-film heat resistance, thick-film flexibility, and thick-film developability.

On the other hand, the photosensitive polyimide resin compositions of Comparative Examples 1 to 3 provided a low elongation rate at break when formed into a thick film having a thickness of 30 μm, and were poor in thick-film flexibility.

The invention claimed is:

1. A photosensitive polyimide resin composition comprising:

a ring-closed polyimide resin (A) having a structure represented by Formula (1); and a polyfunctional radically polymerizable compound (B) having radically polymerizable functional groups and oxyalkylene groups, wherein each of the oxyalkylene groups comprises at least one selected from the group consisting of an oxyethylene group and an oxypropylene group, wherein a number of the radically polymerizable functional groups in the polyfunctional radically polymerizable compound (B) is 3 or greater and 100 or less, and wherein a total number of moles of the oxyalkylene groups added in the polyfunctional radically polymerizable compound (B) is 5 or greater and 100 or less:

(1)

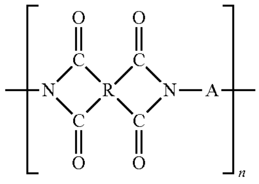

where R is a tetravalent group having a structure represented by removal of four hydrogen atoms from cyclohexane, cyclopentane, cyclobutane, or bicyclopentane; A has at least one group selected from the group consisting of an aliphatic hydrocarbon group, an alicyclic hydrocarbon group, an aromatic hydrocarbon group, and an organosiloxane group, and is a divalent group with 2 or more and 39 or less carbons; on a main chain of A, at least one intervening group selected from the group consisting of —O—, —$SO_2$—, —CO—, —$CH_2$—, —$C(CH_3)_2$—, —$C_2H_4O$—, and —S— may be present; n represents a number of repeating units; terminal ends of Formula (1) are each selected from the group consisting of a group represented by Formula (2), a group represented by Formula (3), and a hydrogen atom, and at least one of the terminal ends is a group represented by Formula (2) or (3), (2)

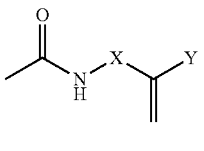

-continued

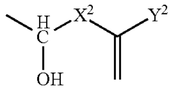

(3)

where X and $X^2$ are each independently a group with 2 or more and 15 or less carbons, and may have at least one group selected from the group consisting of ester bonds and double bonds; and Y and $Y^2$ are each independently a hydrogen atom or a methyl group, wherein a glass transition temperature of a resin film having a thickness of 30 μm is 180° C. or higher, the resin film being produced by:

prebaking the photosensitive polyimide resin composition at 100° C. for 5 minutes; exposing the prebaked photosensitive polyimide resin composition to light irradiated from a high-pressure mercury lamp, with wavelengths of less than 365 nm being cut, at an optimum exposure amount within a range of 250 mJ/cm$^2$ or greater and 5000 mJ/cm$^2$ or less; and then heating the exposed photosensitive polyimide resin composition under conditions: at 200° C. for 2 hours in a nitrogen atmosphere.

2. The photosensitive polyimide resin composition according to claim 1, wherein a weight average molecular weight of the ring-closed polyimide resin (A) is 5000 or greater and 70000 or less.

3. The photosensitive polyimide resin composition according to claim 1, wherein a content of the ring-closed polyimide resin (A) is 30 mass % or greater when a total solid content of the photosensitive polyimide resin composition is 100 mass %.

4. The photosensitive polyimide resin composition according to claim 1, wherein a content of the polyfunctional radically polymerizable compound (B) is 20 parts by mass or greater and 100 parts by mass or less when an amount of the ring-closed polyimide resin (A) contained in the photosensitive polyimide resin composition is 100 parts by mass.

5. The photosensitive polyimide resin composition according to claim 1, wherein each of the radically polymerizable functional groups comprises a (meth)acryloyl group.

6. The photosensitive polyimide resin composition according to claim 1, wherein the number of the radically polymerizable functional groups in the polyfunctional radically polymerizable compound (B) is 6 or greater.

7. The photosensitive polyimide resin composition according to claim 1, wherein a number average molecular weight of the polyfunctional radically polymerizable compound (B) is 500 or greater and 10000 or less.

8. The photosensitive resin composition according to claim 1, wherein an elongation rate at break of the resin film having a thickness of 30 μm is 8% or greater.

9. The photosensitive polyimide resin composition according to claim 1, wherein a light transmittance at a wavelength of 365 nm of the ring-closed polyimide resin (A), when formed into a solution with a solid content concentration of 3 mass %, is 80% or greater.

10. The photosensitive polyimide resin composition according to claim 1, wherein A in Formula (1) comprises the aromatic hydrocarbon group.

11. The photosensitive polyimide resin composition according to claim 1, wherein at least one of A in Formula (1) is a structure selected from the group consisting of the following structures:

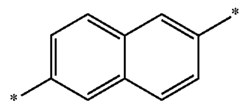

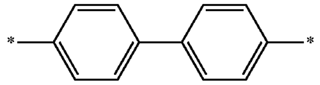

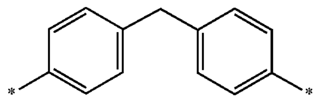

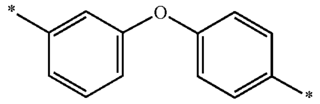

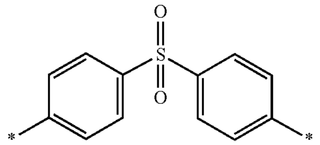

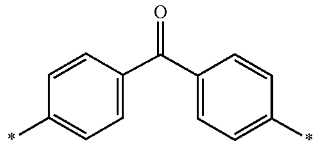

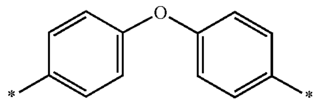

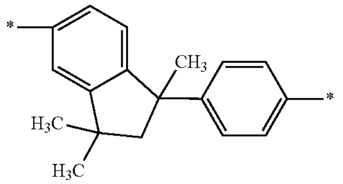

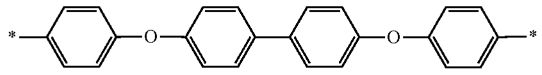

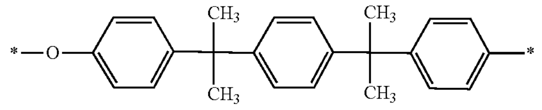

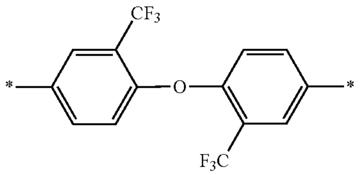

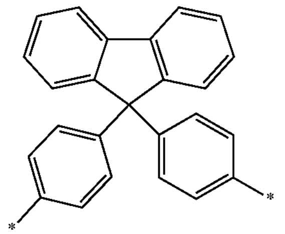

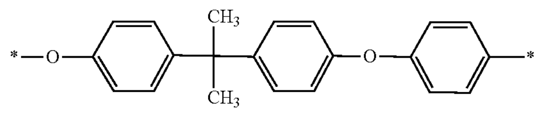

-continued

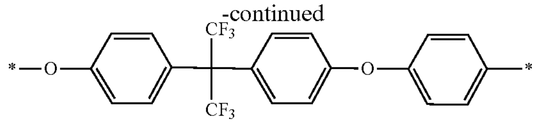

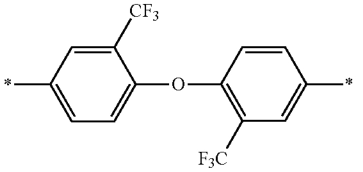

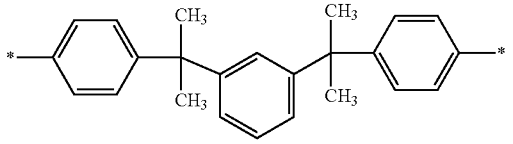

where * indicates an atomic bond.

12. The photosensitive polyimide resin composition according to claim 1, wherein the ring-closed polyimide resin (A) comprises at least one of units composed of 4,4'-diamino-2,2'-bis(trifluoromethyl)biphenyl, 1-(4-aminophenyl)-2,3-dihydro-1,3,3-trimethyl-1H-inden-5-amine, 4,4'-oxybis [3-(trifluoromethyl)benzenamine] or 1,3-bis [2-(4-aminophenyl)-2-propyl] benzene.

13. The photosensitive polyimide resin composition according to claim 1, further comprising at least one selected from the group consisting of a photopolymerization initiator, a solvent, an adhesion improver, a surface conditioner, and a sensitizer.

14. The photosensitive polyimide resin composition according to claim 1, wherein the photosensitive polyimide resin composition is used for forming an insulating film.

15. A resin film comprising: the photosensitive polyimide resin composition described in claim 1 or a cured product of the photosensitive polyimide resin composition.

16. The resin film according to claim 15, wherein a thickness of the resin film is 20 μm or greater.

17. An electronic device comprising: the resin film described in claim 16.

18. A photosensitive polyimide resin composition comprising:

a ring-closed polyimide resin (A) having a structure represented by Formula (1); and a polyfunctional radically polymerizable compound (B) having radically polymerizable functional groups and oxyalkylene groups, wherein each of the oxyalkylene groups comprises at least one selected from the group consisting of an oxyethylene group and an oxypropylene group, wherein a number of the radically polymerizable functional groups in the polyfunctional radically polymerizable compound (B) is 3 or greater and 100 or less, and wherein a total number of moles of the oxyalkylene groups added in the polyfunctional radically polymerizable compound (B) is 5 or greater and 100 or less:

(1)

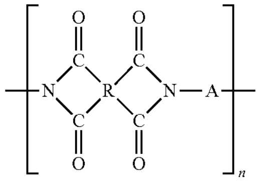

where R is a tetravalent group having a structure represented by removal of four hydrogen atoms from cyclohexane, cyclopentane, cyclobutane, or bicyclopentane; A has at least one group selected from the group consisting of an aliphatic hydrocarbon group, an alicyclic hydrocarbon group, an aromatic hydrocarbon group, and an organosiloxane group, and is a divalent group with 2 or more and 39 or less carbons; on a main chain of A, at least one intervening group selected from the group consisting of —O—,—$SO_2$—, —CO—,—$CH_2$—,—$C(CH_3)_2$—,—$C_2H_4O$—, and —S— may be present; n represents a number of repeating units; terminal ends of Formula (1) are each selected from the group consisting of a group represented by Formula (2), a group represented by Formula (3), and a hydrogen atom, and at least one of the terminal ends is a group represented by Formula (2) or (3), (2)

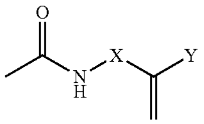

(3)

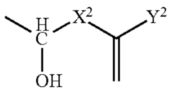

where X and $X^2$ are each independently a group with 2 or more and 15 or less carbons, and may have at least one group selected from the group consisting of ester bonds and double bonds; and Y and $Y^2$ are each independently a hydrogen atom or a methyl group, wherein an elongation rate at break of a resin film having a thickness of 30 μm is 8% or greater, the resin film being produced by:

prebaking the photosensitive polyimide resin composition at 100° C. for 5 minutes;

exposing the prebaked photosensitive polyimide resin composition to light irradiated from a high-pressure mercury lamp, with wavelengths of less than 365 nm being cut, at an optimum exposure amount within a range of 250 mJ/$cm^2$ or greater and 5000 mJ/$cm^2$ or less; and then heating the exposed photosensitive polyimide resin composition under conditions: at 200° C. for 2 hours in a nitrogen atmosphere.

* * * * *